US012707702B2

(12) United States Patent
Uhm et al.

(10) Patent No.: US 12,707,702 B2
(45) Date of Patent: Aug. 11, 2026

(54) SEMICONDUCTOR DEVICE INCLUDING VERTICAL CHANNEL PATTERN AND METHOD FOR FABRICATING THE SAME

(71) Applicant: Samsung Electronics Co., Ltd., Suwon-si (KR)

(72) Inventors: Sanghoon Uhm, Suwon-si (KR); Min Hee Cho, Suwon-si (KR); Wonsok Lee, Suwon-si (KR); Wooje Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 435 days.

(21) Appl. No.: 18/364,612

(22) Filed: Aug. 3, 2023

(65) Prior Publication Data

US 2024/0282833 A1 Aug. 22, 2024

(30) Foreign Application Priority Data

Feb. 20, 2023 (KR) ........................ 10-2023-0022048

(51) Int. Cl.
*H10D 64/27* (2025.01)
*H10B 12/00* (2023.01)
*H10D 64/68* (2025.01)

(52) U.S. Cl.
CPC ....... *H10D 64/514* (2025.01); *H10B 12/0335* (2023.02); *H10B 12/315* (2023.02); *H10B 12/482* (2023.02); *H10B 12/488* (2023.02); *H10D 64/693* (2025.01)

(58) Field of Classification Search
CPC .. H10B 12/315; H10B 12/482; H10B 12/488; H10D 64/514
See application file for complete search history.

(56) References Cited

U.S. PATENT DOCUMENTS 8,501,555 B2 8/2013 Yamazaki et al.
9,230,985 B1 1/2016 Wu et al.
10,903,333 B2 1/2021 Cao et al.
11,107,905 B2 8/2021 Miao et al.
11,145,763 B2 10/2021 Pillarisetty et al.
11,430,895 B2 8/2022 Karda et al.
2022/0102352 A1* 3/2022 Lee ...................... H10B 12/315
2022/0223732 A1* 7/2022 Ryu ...................... H10B 12/05
2022/0246180 A1* 8/2022 Lee ...................... H10B 12/488

* cited by examiner

*Primary Examiner* — Steven M Page
(74) *Attorney, Agent, or Firm* — Harness, Dickey & Pierce, P.L.C.

(57) ABSTRACT

A semiconductor device may include a bit line on the substrate, a channel pattern on the bit line and extending in a direction perpendicular to the bit line, a word line intersecting the bit line and spaced apart from the channel pattern, a gate insulating pattern between the channel pattern and the word line, an insulating pattern on the word line, and a landing pad connected to the channel pattern. The gate insulating pattern may include a first gate insulating pattern and a second gate insulating pattern having a first dielectric constant and a second dielectric constant, respectively. The second gate insulating pattern may be between the first gate insulating pattern and the word line. The first and second dielectric constants may be different. A first width of the first gate insulating pattern may be different from a second width of the second gate insulating pattern.

20 Claims, 20 Drawing Sheets

CS
PS
150
110
SA
100
B'
B
A'
A
120
WL2
140
WL1
Gox2
130
Gox1
TRC
DSP
LP
CP
Gox
BL
P1
Z
X
Y

SEMICONDUCTOR DEVICE INCLUDING VERTICAL CHANNEL PATTERN AND METHOD FOR FABRICATING THE SAME

CROSS-REFERENCE TO RELATED APPLICATION

This application claims priority to and the benefit of Korean Patent Application No. 10-2023-0022048 filed in the Korean Intellectual Property Office on Feb. 20, 2023, the entire contents of which are incorporated herein by reference.

BACKGROUND

1. Field

The disclosure relates to a semiconductor device and/or a method for fabricating the same.

2. Description of the Related Art

There may be a need to increase the degrees of integration of semiconductor memory devices in order to meet the excellent performance and low price required by customers. Semiconductor memory devices may require higher degrees of integration since the degree of integration may be an important factor in determining the prices of goods.

Two-dimensional or planar semiconductor memory devices may be greatly affected by the levels of fine patterning techniques since the degrees of integration of them may be mainly determined by the areas which are occupied by unit memory cells. However, since fine patterning may require super-expensive pieces of equipment, even though the degrees of integration of two-dimensional semiconductor memory devices have been increasing, they are still limited. For this reason, semiconductor memory devices including vertical channel transistors in which channels extend in the vertical direction have been proposed.

SUMMARY

The present disclosure relates a semiconductor device having improved reliability and/or productivity, and/or a method for fabricating the same.

According to an embodiment of inventive concepts, a semiconductor device may include a substrate; a bit line on the substrate; a channel pattern on the bit line, the channel pattern extending in a direction perpendicular to an upper surface of the bit line; a word line intersecting the bit line and being spaced apart from the channel pattern; a gate insulating pattern between the channel pattern and the word line; an insulating pattern on the word line; and a landing pad connected to the channel pattern. The gate insulating pattern may include a first gate insulating pattern and a second gate insulating pattern. The first gate insulating pattern may be on the channel pattern and may have a first dielectric constant. The second gate insulating pattern may be between the first gate insulating pattern and the word line. The second gate insulating pattern may have a second dielectric constant. The second dielectric constant may be different from the first dielectric constant. The first gate insulating pattern may have a first width. The second gate insulating pattern may have a second width. The second width may be different from the first width.

According to an embodiment of inventive concepts, a semiconductor device may include a substrate; a bit line on the substrate; a channel pattern on the bit line, the channel pattern including a horizontal part, a first vertical part, and a second vertical part, the first vertical part extending in a vertical direction from a first end part of the horizontal part and the second vertical part extending in the vertical direction from a second end part of the horizontal part; a word line intersecting the bit line, the word line including a first word line and a second word line spaced apart from each other between the first vertical part and the second vertical part; a gate insulating pattern between the channel pattern and the word line; an insulating pattern on the word line; and a landing pad connected to the channel pattern. The gate insulating pattern may include a first gate insulating pattern and a second gate insulating pattern. The first gate insulating pattern may be on the channel pattern and may have a first dielectric constant. The second gate insulating pattern may be between the first gate insulating pattern and the word line. The second gate insulating pattern may have a second dielectric constant. The second dielectric constant may be larger than the first dielectric constant. A width of the first gate insulating pattern may be smaller than a width of the second gate insulating pattern. Portions of the second gate insulating pattern may be spaced apart from each other with the insulating pattern therebetween.

According to an embodiment of inventive concepts, a method for fabricating a semiconductor device may include forming a bit line on a substrate; forming a channel pattern on the bit line; forming a gate insulating pattern on the channel pattern, the gate insulating pattern including a first gate insulating pattern having a first dielectric constant and a second gate insulating pattern on the first gate insulating pattern, the second gate insulating pattern having a second dielectric constant, the second dielectric constant being larger than the first dielectric constant; forming a word line on the second gate insulating pattern, the word line intersecting the channel pattern and being spaced apart from the channel pattern; forming an insulating pattern on the word line; and forming a landing pad connected to the channel pattern, a width of the first gate insulating pattern is smaller than a width of the second gate insulating pattern.

According to embodiments of inventive concepts, a semiconductor device with improved electrical characteristics can be provided by arranging a gate insulating pattern consisting of (or including) multiple layers having different characteristics between channel patterns and word lines so as to reduce leakage current.

DETAILED DESCRIPTION

Figure 1:
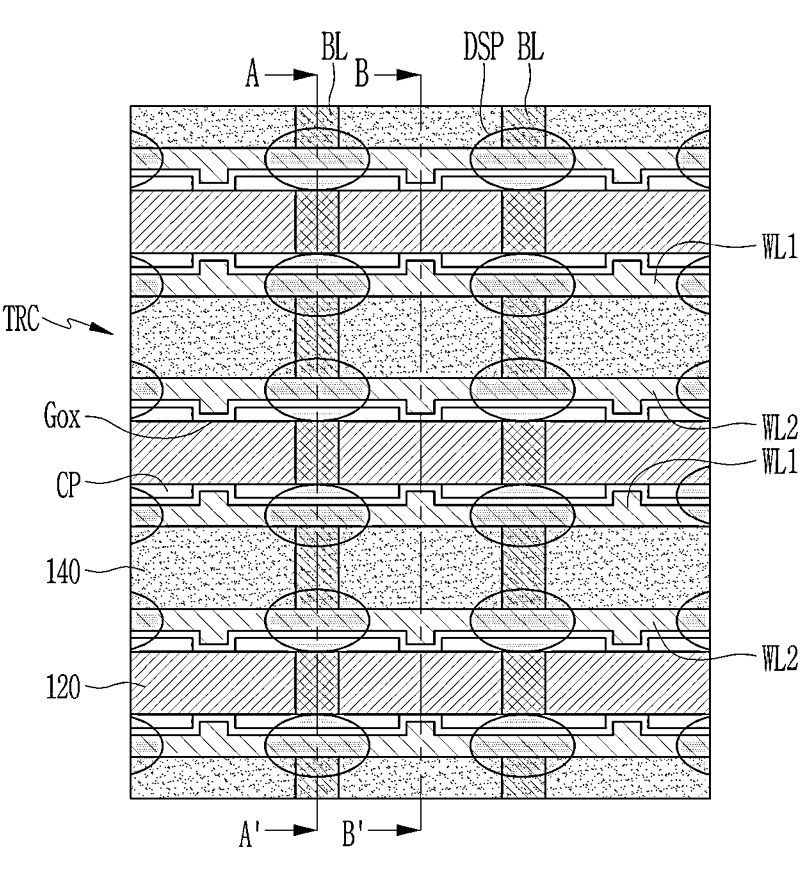
FIG. 1 is a layout diagram for explaining a semiconductor device according to an embodiment.
Figure 1:
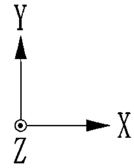

Expressions such as "at least one of" and "one or more of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

In the following detailed description, only certain embodiments of inventive concepts have been shown and described, simply by way of illustration. Inventive concepts can be variously implemented and is not limited to the following embodiments.

The drawings and description are to be regarded as illustrative in nature and not restrictive. Like reference numerals designate like elements throughout the specification.

In addition, the size and thickness of each configuration shown in the drawings are arbitrarily shown for understanding and ease of description, but inventive concepts is not limited thereto. In the drawings, the thickness of layers, films, panels, regions, etc., are exaggerated for clarity. In the drawings, for understanding and ease of description, the thickness of some layers and areas is exaggerated.

Further, it will be understood that when an element such as a layer, film, region, or substrate is referred to as being "on" another element, it can be directly on the other element or intervening elements may also be. In contrast, when an element is referred to as being "directly on" another element, there are no intervening elements. Further, when an element is "on" a reference portion, the element is located above or below the reference portion, and it does not necessarily mean that the element is located "above" or "on" in a direction opposite to gravity.

In addition, unless explicitly described to the contrary, the word "comprise", and variations such as "comprises" or "comprising", will be understood to imply the inclusion of stated elements but not the exclusion of any other elements.

Further, throughout this specification, when it is referred to as "on a plane", it means when a target part is viewed from above, and when it is referred to as "on a cross-section", it means when the cross-section obtained by cutting a target part vertically is viewed from the side.

Figure 2:
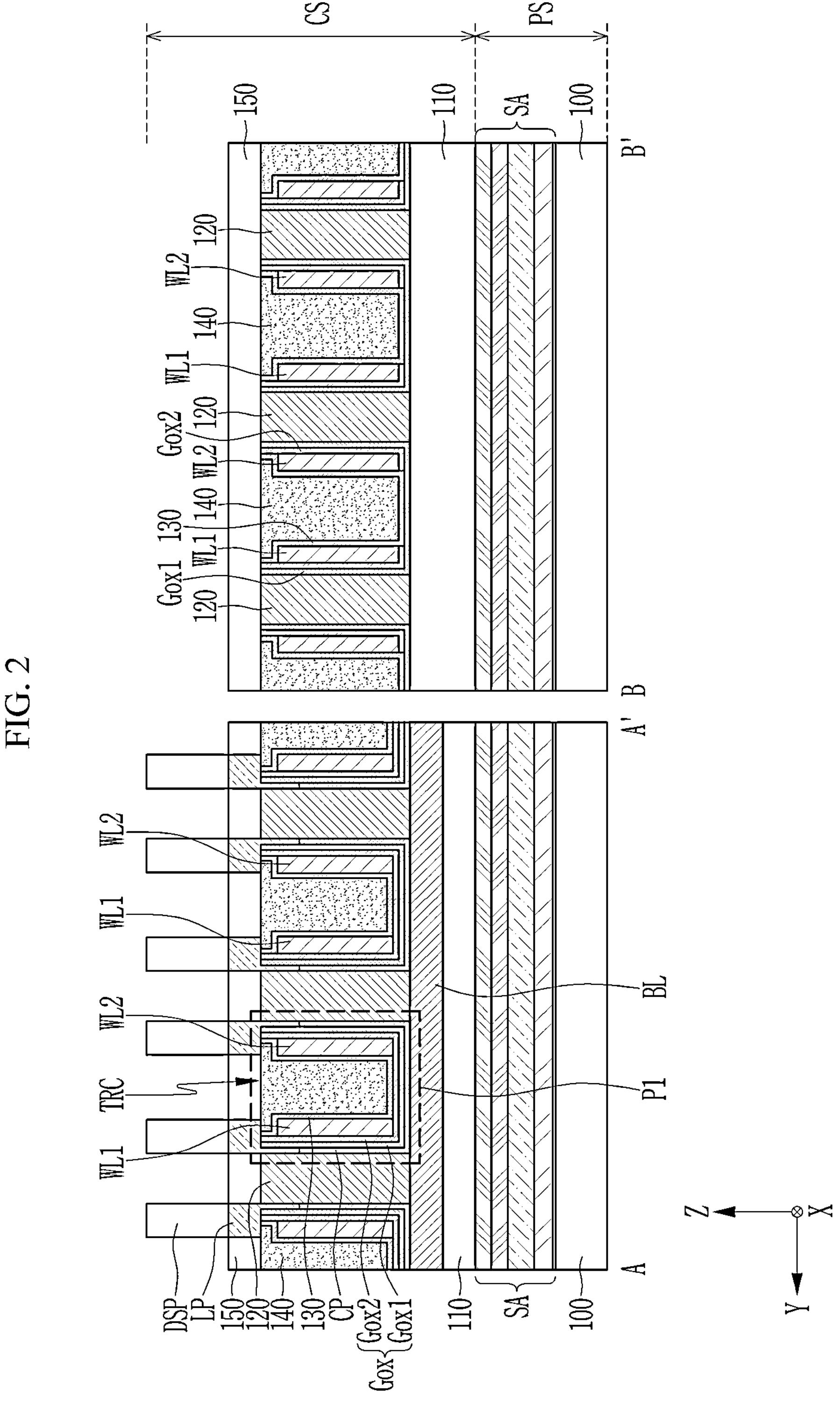
FIG. 2 is cross-sectional views taken along line A-A' and line B-B' of FIG. 1.
Figure 3:
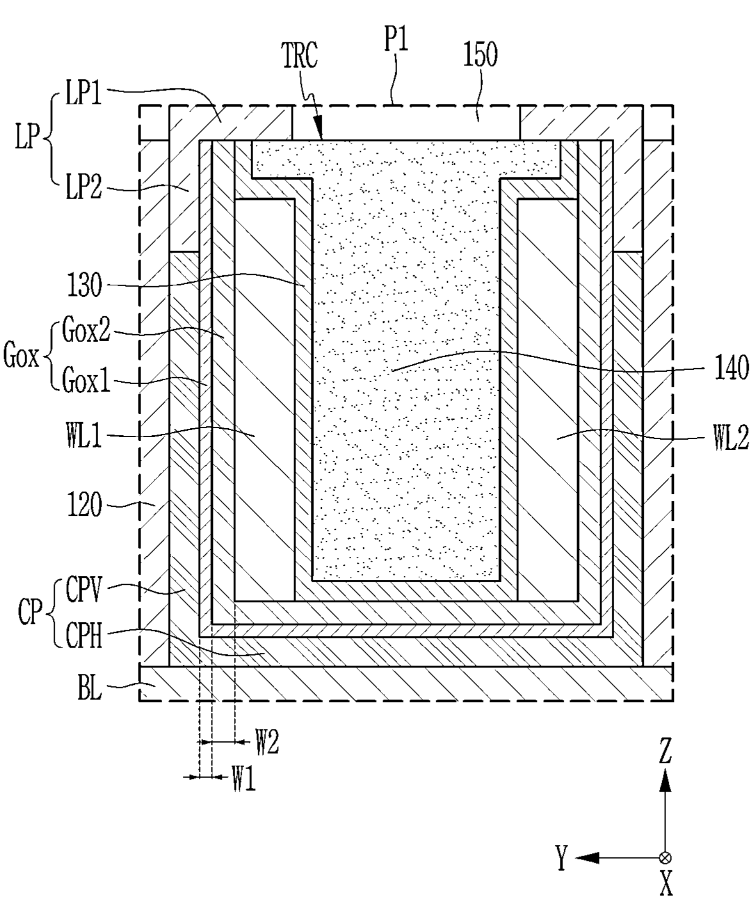
FIG. 3 is an enlarged view of part P1 of FIG. 2.

FIG. 1 is a layout diagram for explaining a semiconductor device according to an embodiment, and FIG. 2 is cross-sectional views taken along line A-A' and line B-B' of FIG. 1. FIG. 3 is an enlarged view of part P1 of FIG. 2.

Referring to FIG. 1 to FIG. 3, a semiconductor device according to an embodiment may include a peripheral circuit structure PS, and a cell array structure CS located on the peripheral circuit structure PS.

The peripheral circuit structure PS may include a substrate 100, and core and peripheral circuits SA integrated on the upper surface of the substrate 100. The substrate 100 may have a structure in which a base substrate and an epitaxial layer are stacked, but is not limited thereto. For example, in some embodiments, the substrate 100 may be a silicon substrate, a gallium arsenic substrate, a silicon germanium substrate, or an SOI (Semiconductor on Insulator) substrate. Hereinafter, the substrate 100 will be described as a silicon substrate.

The core and peripheral circuits SA may include NMOS and PMOS transistors integrated on the substrate 100. The core and peripheral circuits SA may be electrically coupled to bit lines BL through peripheral circuit wiring lines and peripheral circuit contact plugs. In other words, sense amplifiers may be electrically coupled to the bit lines BL, and each sense amplifier may amplify and output a difference in voltage level sensed from a pair of bit lines BL.

The cell array structure CS may include memory cells including vertical channel transistors (VCTs). The vertical channel transistors may refer to structures having channels extending in a direction perpendicular to the upper surface of the substrate 100.

In an embodiment, the cell array structure CS may include a lower insulating layer 110, bit lines BL, first insulating patterns 120, channel patterns CP, word lines WL1 and WL2, gate insulating patterns Gox, second insulating patterns 130, third insulating patterns 140, landing pads LP, an interlayer insulating layer 150, and data storage patterns DSP.

The lower insulating layer 110 may cover the core and peripheral circuits SA, the peripheral circuit wiring lines, and the peripheral circuit contact plugs on the substrate 100. The lower insulating layer 110 may include multiple insulating films stacked. For example, the lower insulating layer 110 may include a silicon oxide film, a silicon nitride film, a silicon oxynitride film, and/or a low dielectric film.

The bit lines BL may be disposed on the substrate 100. For example, on the substrate 100, the lower insulating layer 110 may be disposed, and on the lower insulating layer 110, the bit lines BL may be disposed. The lower insulating layer 110 may be disposed so as to fill the spaces between the bit lines BL.

In an embodiment, the upper surfaces of the parts of the lower insulating layer 110 located between the bit lines BL may be disposed on substantially the same level with the upper surfaces of the bit lines BL.

The bit lines BL may extend long in a second direction (Y direction). The plurality of bit lines BL may each extend in the second direction (Y direction) and be spaced apart from each other in a first direction (X direction) intersecting with the second direction (Y direction).

The bit lines BL may contain doped polysilicon, a metal, conductive metal nitride, conductive metal silicide, conductive metal oxide, or a combination thereof. For example, the bit lines BL may be formed of Al, Cu, Ti, Ta, Ru, W, Mo, Pt, Ni, Co, TiN, TaN, WN, NbN, TiAl, TiAlN, TiSi, TiSIN, TaSi, TaSiN, RuTiN, NiSi, CoSi, IrOx, RuOx, or a combination thereof; but are not limited thereto. The bit lines BL may include a single layer or multiple layers formed of the above-mentioned materials.

In some embodiments, the bit lines BL may contain a two-dimensional semiconductor material, and examples of the two-dimensional semiconductor material may include graphene, carbon nanotubes, and combinations thereof.

The first insulating patterns 120 may be disposed on the lower insulating layer 110. In an embodiment, the first insulating patterns 120 may be located on the upper surfaces of the bit lines BL. The first insulating patterns 120 may extend in the first direction (X direction) so as to intersect the bit lines BL, and be disposed to be apart in the second direction (Y direction).

The first insulating patterns 120 may extend in the first direction (X direction) so as to intersect the bit lines BL, and form channel trenches TRC which are spaced apart in the second direction (Y direction).

The first insulating patterns 120 may contain, for example, at least one of silicon oxide, silicon oxynitride, silicon nitride, and a low dielectric (low-k) material having a dielectric constant smaller than that of silicon oxide, but are not limited thereto.

The low dielectric material may contain at least one of FOX (Flowable Oxide), TOSZ (Torene SilaZene), USG (Undoped Silicate Glass), BSG (Borosilicate Glass), PSG (PhosphoSilicate Glass), BPSG (BoroPhosphoSilicate Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SILK, polyimide, a porous polymeric material, and combinations thereof, but is not limited thereto.

The channel patterns CP may be disposed on the bit lines BL. On each bit line BL, the channel patterns CP may be spaced apart in the second direction (Y direction). In other words, the channel patterns CP may be spaced apart in the first direction (X direction) and the second direction (Y direction) intersecting with each other, and be arranged in a matrix form.

Each channel pattern CP may include a first source/drain region and a second source/drain region. For example, the lower part of each channel pattern CP may be connected to a bit line BL so as to be able to function as a first source/drain region, and the upper part of each channel pattern CP is connected to a landing pad LP so as to be able to function as a second source/drain region, and the part of each channel pattern CP between the first source/drain region and the second source/drain region may function as a channel region.

The channel patterns CP may be disposed inside the channel trenches TRC, respectively, so as to be spaced apart in the second direction (Y direction). In other words, between channel patterns CP adjacent to each other in the second direction (Y direction), a first insulating pattern 120 may be disposed. The channel patterns CP may be located inside the first insulating patterns 120 spaced apart in the second direction (Y direction). In other words, the channel patterns CP may extend along the profiles of the channel trenches TRC. Accordingly, in a cross-sectional view, the channel patterns CP may have substantially a U shape, but are not limited thereto.

Each of the channel patterns CP may include a horizontal part CPH that extends in the second direction (Y direction) and is disposed on the bit lines BL, and vertical parts CPV that extend in a third direction (Z direction) from the end parts of the horizontal part CPH and face each other in the second direction (Y direction).

The channel patterns CP may contain an oxide semiconductor material. Examples of the oxide semiconductor material may include IGZO (Indium Gallium Zinc Oxide), IGSO (Indium Gallium Silicon Oxide,), ITZO (Indium Tin Zinc Oxide), IGTO (Indium Gallium Tin Oxide), IZO (Indium Zinc Oxide), ZnO (Zinc Oxide), ZTO (Zinc Tin Oxide), ZnON (zinc oxynitride), ZZTO (Zirconium Zinc Tin Oxide), SnO (Tin Oxide), HIZO (Hafnium Indium Zinc Oxide), GZTO (Gallium Zinc Tin Oxide), AZTO (Aluminum Zinc Tin Oxide), YGZO (Ytterbium Gallium Zinc Oxide), IGO (Indium Gallium Oxide), and combinations thereof. In some embodiments, the channel patterns CP may include a single layer or multiple layers formed of the above-mentioned oxide semiconductor materials.

As another example, the channel patterns CP may contain a two-dimensional semiconductor material. Examples of the above-mentioned two-dimensional semiconductor material may include graphene, carbon nanotubes, and combinations thereof.

The word lines WL1 and WL2 may extend in the first direction (X direction) so as to intersect the bit lines BL, and be arranged to be apart in the second direction (Y direction). The word lines WL1 and WL2 may be spaced apart from the bit lines BL in the third direction (Z direction), and intersect the bit lines BL. Each pair of word lines WL1 and WL2 may be located in a channel pattern CP inside a channel trench TRC Each pair of word lines WL1 and WL2 are disposed in a channel pattern CP such that one surface of the word line WL1 and one surface of the word line WL2 face each other.

The surfaces of the word lines WL1 and WL2 facing each other may be in contact with a second insulating pattern 130 to be described below, and the opposite surfaces of them to the above-mentioned surfaces may be in contact with a second gate insulating pattern Gox2 to be described below.

Each of the word lines WL1 and WL2 may have an upper surface and a lower surface opposite to each other in the third direction (Z direction). The upper surfaces of the word lines WL1 and WL2 may be in contact with the second insulating pattern 130 to be described below, and face landing pads LP with the second insulating pattern 130 interposed therebetween.

The lower surfaces of the word lines WL1 and WL2 may be in contact with the second gate insulating pattern Gox2 to be described below, and face the bit lines BL with a first gate insulating pattern Gox1 and the channel pattern CP interposed therebetween.

The word lines WL1 and WL2 may contain, for example, doped polysilicon, a metal, conductive metal nitride, conductive metal silicide, conductive metal oxide, or a combination thereof. For example, the word lines WL1 and WL2 may be formed of Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof, but are not limited thereto.

The word lines WL1 and WL2 may include a single layer or multiple layers formed of the above-mentioned materials. In some embodiments, the word lines WL1 and WL2 may contain a two-dimensional semiconductor material, and examples of the two-dimensional semiconductor material may include graphene, carbon nanotubes, and combinations thereof.

Between the channel pattern CP and the word lines WL1 and WL2, a gate insulating pattern Gox may be located. The gate insulating pattern Gox may cover the side surfaces of the channel pattern CP and the landing pads LP while conforming to them.

The gate insulating pattern Gox may include a first gate insulating pattern Gox1 and a second gate insulating pattern Gox2.

The first gate insulating pattern Gox1 may extend along the profile of the channel pattern CP, and have substantially a U shape in a cross-sectional view.

The first gate insulating pattern Gox1 may be interposed between the lower surfaces of the word lines WL1 and WL2 and the horizontal part of the channel pattern CP, between the second insulating pattern 130 and the horizontal part of the channel pattern CP, between the side surfaces of the word lines WL1 and WL2 adjacent to the channel pattern CP and the vertical parts of the channel pattern CP, and between the second insulating pattern 130 and the landing pads LP.

One side surface of the first gate insulating pattern Gox1 may be in contact with the channel pattern CP and the landing pads LP, and the other side surface of the first gate insulating pattern Gox1 may be in contact with the second gate insulating pattern Gox2 to be described below.

Further, parts of the first gate insulating pattern Gox1 may protrude in the third direction (Z direction) from the upper surfaces of the word lines WL1 and WL2. The parts of the first gate insulating pattern Gox1 may protrude in the third direction (Z direction) from the upper surfaces of the channel pattern CP, and be in contact with the landing pads LP.

The first gate insulating pattern $Gox_1$ may contain aluminum oxide ($Al_2O_3$), silicon oxide ($SiO_2$), or a combination thereof. Also, the first gate insulating pattern Gox1 may contain a low dielectric (low-k) material having a dielectric constant relatively smaller than that of silicon oxide ($SiO_2$). For example, the first gate insulating pattern Gox1 may contain silicon oxynitride (SiON), silicon oxycarbonitride (SiCON) or a combination thereof. However, the material which is contained in the first gate insulating pattern Gox1 is not limited thereto, and may be variously changed.

Since the first gate insulating pattern Gox1 containing a material such as aluminum oxide ($Al_2O_3$) or silicon oxide ($SiO_2$) has less defects, interface characteristics can improve at the contact interface with the channel pattern CP.

The second gate insulating pattern Gox2 may be interposed between the first gate insulating pattern Gox1 and the word lines WL1 and WL2. In other words, the second gate insulating pattern Gox2 may be located between the first gate insulating pattern Gox1 and the word lines WL1 and WL2, and extends along the profile of the first gate insulating pattern Gox1, and have substantially a U shape in a cross-sectional view.

The second gate insulating pattern Gox2 may be interposed between the lower surfaces of the word lines WL1 and WL2 and the first gate insulating pattern Gox1 and between the second insulating pattern 130 and the first gate insulating pattern Gox1. In other words, one side surface of the second gate insulating pattern Gox2 may be in contact with the first gate insulating pattern Gox1, and the other side surface of the second gate insulating pattern Gox2 may be in contact with the word lines WL1 and WL2 and the second insulating pattern 130.

The second gate insulating pattern Gox2 may contain a high dielectric (high-k) material having a dielectric constant relatively larger than that of silicon oxide ($SiO_2$). Accordingly, the second gate insulating pattern Gox2 may have a dielectric constant larger than that of the first gate insulating pattern Gox1. For example, the second gate insulating pattern Gox2 may have a dielectric constant of about 5 to about 60. However, the dielectric constant of the second gate insulating pattern Gox2 is not limited to the above-mentioned numerical range, and may be variously changed.

Since the second gate insulating pattern Gox2 has a large dielectric constant, even if the second insulating pattern is formed not to be thin, high capacitance can be secured. Therefore, the second gate insulating pattern Gox2 may be formed to be relatively thick, and the occurrence of a leakage current can be limited and/or prevented.

The high dielectric (high-k) material may contain, for example, an oxide containing one or more of Ti, Ta, Nb, La, Ba, Sr, Y, and Lu. However, the high dielectric (high-k) material is not limited thereto, and may contain an oxide containing one or more of Li, Be, Mg, Ca, Sc, Al, Ce, Pr, Sm, Eu, Gd, Tb, Dy, Ho, Er, Tm, Yb, and the like other than the above-mentioned materials.

The first gate insulating pattern Gox1 may have a first width W1, and the second gate insulating pattern Gox2 may have a second width W2. The first width W1 and the second width W2 refer to the thicknesses of the first gate insulating pattern Gox1 and the second gate insulating pattern Gox2 in the second direction (Y direction), respectively, and also refer to the thicknesses of them in the third direction (Z direction), respectively.

In an embodiment, the first width W1 may be smaller than the second width W2. In other words, the thickness of the first gate insulating pattern Gox1 in the second direction (Y direction) and the thickness of the first gate insulating pattern in the third direction (Z direction) may be smaller than the thickness of the second gate insulating pattern Gox2 in the second direction (Y direction) and the thickness of the second gate insulating pattern in the third direction (Z direction), respectively. As an example, the ratio of the first width W1 to the second width W2 may be about 1:9. As another example, the ratio of the first width W1 to the second width W2 may be about 2:3. However, the ratio of the first width W1 to the second width W2 is not limited to the above-mentioned numerical range.

The first width W1 of the first gate insulating pattern Gox1 and the second width W2 of the second gate insulating pattern Gox2 may increase as their dielectric constants increase. In other words, the first width W1 of the first gate insulating pattern Gox1 and the second width W2 of the second gate insulating pattern Gox2 may be proportional to their dielectric constants.

Since the dielectric constant of the second gate insulating pattern Gox2 is larger than the dielectric constant of the first gate insulating pattern Gox1 as described above, the second width W2 of the second gate insulating pattern Gox2 may be larger than the first width W1 of the first gate insulating pattern Gox1.

As described above, the second gate insulating pattern Gox2 has the second width W2 relatively larger than the first width W1 of the first gate insulating pattern Gox1, and is disposed between the first gate insulating pattern Gox1 and the word lines WL1 and WL2. Therefore, leakage current from the gate insulating pattern Gox disposed between the channel pattern CP and the word lines WL1 and WL2 can decrease.

In an embodiment, the upper surface of the first gate insulating pattern Gox1 and the upper surface of the second gate insulating pattern Gox2 may be located substantially at the same level, and may be in contact with the landing pads LP to be described below. In this specification, the term "same" will be understood to imply not only being completely the same but also minor differences which may occur due to margins in the process and so on.

Also, the upper surface of the first gate insulating pattern Gox1 and the upper surface of the second gate insulating pattern Gox2 may be located at a level higher than the level of the upper surfaces of the word lines WL1 and WL2 and the upper surface of the channel pattern CP. However, the locations of the upper surface of the first gate insulating pattern Gox1 and the upper surface of the second gate insulating pattern Gox2 are not limited thereto, and may be variously changed.

Also, parts of the second insulating pattern 130 may protrude in the third direction (Z direction) from the upper surfaces of the word lines WL1 and WL2, and be in contact with the parts of the second gate insulating pattern Gox2 protruding in the third direction (Z direction) from the upper surfaces of the word lines WL1 and WL2.

The second insulating pattern 130 may contain an insulating material. For example, the second insulating pattern may contain silicon oxide, silicon oxynitride, or a combination thereof. However, the material which is contained in the second insulating pattern 130 is not limited thereto, and may be variously changed.

The third insulating pattern 140 may be formed inside the channel trench TRC. The third insulating pattern 140 may fill the remaining space in the channel trench TRC when the channel pattern CP, the gate insulating pattern Gox, the word lines WL1 and WL2, and the second insulating pattern 130 have been formed.

In other words, the third insulating pattern 140 may include a horizontal part and a vertical part. The vertical part of the third insulating pattern 140 may extend from the horizontal part of the third insulating pattern 140 toward the bit lines BL in the third direction (Z direction). The vertical part of the third insulating pattern 140 may be closer to the bit lines BL than the horizontal part of the third insulating pattern 140 is.

The horizontal part of the third insulating pattern 140 may be disposed on the upper surfaces of the word lines WL1 and WL2, and the vertical part of the third insulating pattern 140 may be disposed on the bit lines BL. Therefore, the third insulating pattern 140 may have substantially a T shape in a cross-sectional view. However, the shape of the third insulating pattern 140 in a cross-sectional view is not limited thereto, and may be variously changed.

The third insulating pattern 140 may contain the same material as that in the second insulating pattern 130. However, the material which is contained in the third insulating pattern is not limited thereto, and the third insulating pattern 140 may contain a material different from that in the second insulating pattern 130.

Each of the landing pads LP may be disposed so as to overlap at least a part of a channel pattern CP in the third direction (Z direction) which is the vertical direction. The landing pads LP may be arranged in a matrix in which they are spaced apart in the first direction (X direction) and the second direction (Y direction). However, this is merely an example, and it goes without saying that the plurality of landing pads LP may be arranged in various other forms such as a honeycomb form as long as they come into contact with the channel patterns CP.

Also, the landing pads LP may have various shapes on a plane, such as a circular shape, an elliptical shape, a rectangular shape, a square shape, a rhombic shape, a hexagonal shape, etc. However, the planar shape of the landing pads LP is not limited thereto.

The landing pads LP may be disposed on the first insulating patterns 120 and the third insulating patterns 140. The landing pads LP may be connected to the channel patterns CP. The landing pads LP may pass through the interlayer insulating layer 150 and be in contact with the upper parts of the channel patterns CP.

Each of the landing pads LP may include a first part LP1 extending in the second direction (Y direction), and a second part LP2 extending in the third direction (Z direction) from the first part LP1.

The first part LP1 of each landing pad LP may be disposed on the upper surface of a channel pattern CP, the upper surface of a gate insulating pattern Gox, the upper surface of a second insulating pattern 130, and the upper surface of a third insulating pattern 140. FIG. 3 shows that the lower surfaces of the first parts LP1 of the landing pads LP are located substantially on the same level with the upper surfaces of the channel patterns CP, the upper surfaces of the gate insulating patterns Gox, the upper surfaces of the second insulating patterns 130, and the upper surfaces of the third insulating patterns 140; however, the locations of the lower surfaces of the first parts are not limited thereto. In some embodiments, the locations of the lower surfaces of the first parts LP1 of the landing pads LP may be variously changed.

The second parts LP2 of the landing pads LP may extend in the third direction (Z direction) from the first parts LP1, and be in contact with the upper surfaces of the channel pattern CP.

Also, one side of each of the second parts LP2 of the landing pads LP may be in contact with a first insulating pattern 120, and the other side may be in contact with a first gate insulating pattern Gox1. The lower surfaces of the second parts LP2 of the landing pads LP may be located at a level lower than the level of the upper surfaces of the word lines WL1 and WL2. However, the locations of the lower surfaces of the second parts are not limited thereto.

In some embodiments, the lower surfaces of the second parts LP2 of the landing pads LP may be located substantially on the same level with the upper surfaces of the word lines WL1 and WL2.

The landing pads LP may contain doped polysilicon, a metal, conductive metal nitride, conductive metal silicide, conductive metal oxide, or a combination thereof. For example, the landing pads LP may contain Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof, but are not limited thereto.

The interlayer insulating layer 150 may fill the spaces between the landing pads LP disposed on the first insulating patterns 120 and the third insulating patterns 140 and spaced apart in the second direction (Y direction). For example, the lower surface of the interlayer insulating layer 150 may be located substantially on the same level with the lower surfaces of the first parts LP1 of the landing pads LP. However, the location of the lower surface of the interlayer insulating layer is not limited thereto, and in some embodiments, the lower surface of the interlayer insulating layer 150 may be located at a level different from the level of the lower surfaces of the first parts LP1 of the landing pads LP.

The data storage patterns DSP may be disposed on the landing pads LP, respectively. The data storage patterns DSP may be electrically coupled to the channel patterns CP through the landing pads LP, respectively. The data storage patterns DSP may be arranged in a matrix form in the first direction (X direction) and the second direction (Y direction), as shown in FIG. 1.

In an embodiment, the data storage patterns DSP may be capacitors, and may include lower and upper electrodes, and capacitor dielectric films interposed therebetween. When the data storage patterns DSP have the above-mentioned structure, the lower electrodes may be in contact with the landing pads LP, and the lower electrodes may have various shapes on a plane, such as a circular shape, an elliptical shape, a rectangular shape, a square shape, a rhombic shape, a hexagonal shape, etc.

Alternatively, the data storage patterns DSP may be variable resistance patterns which can be switched between two resistance states by electrical pulses applied to memory elements. For example, the data storage patterns DSP may contain a phase-change material whose crystalline state changes depending on the amount of current, perovskite compounds, transition metal oxides, magnetic materials, ferromagnetic materials, or antiferromagnetic materials.

Gate insulating patterns Gox according to a semiconductor device 100 of an embodiment may be formed of multiple layers, which include first gate insulating patterns Gox1 containing aluminum oxide ($Al_2O_3$), silicon oxide ($SiO_2$), or a low dielectric (low-k) material having a dielectric constant relatively smaller than that of silicon oxide, and second gate insulating patterns Gox2 containing a high dielectric (high-k) material having a dielectric constant relatively larger than that of silicon oxide. Therefore, a semiconductor device with improved reliability can be provided.

In other words, by the first gate insulating patterns Gox1 containing a low dielectric (low-k) material having a small dielectric constant, it is possible to limit and/or prevent the quality of the channel patterns CP from deteriorating in the subsequent processes (for example, due to permeation of hydrogen (H), etc.) while improving the interface characteristics at the contact interfaces with the channel patterns CP.

Further, by the second gate insulating patterns Gox2 containing a high dielectric (high-k) material having a large dielectric constant, it is possible to effectively control leakage current. Therefore, a semiconductor device with excellent performance and operating characteristics can be provided.

Hereinafter, other embodiments of the semiconductor device will be described with reference to FIG. 4 to FIG. 6. In the following embodiments, components identical to those in the above-described embodiment will be denoted by the same reference symbols, and a redundant description thereof will not be made or will be made in brief, and the differences in them from the above-described embodiment will be mainly described.

Figure 4:
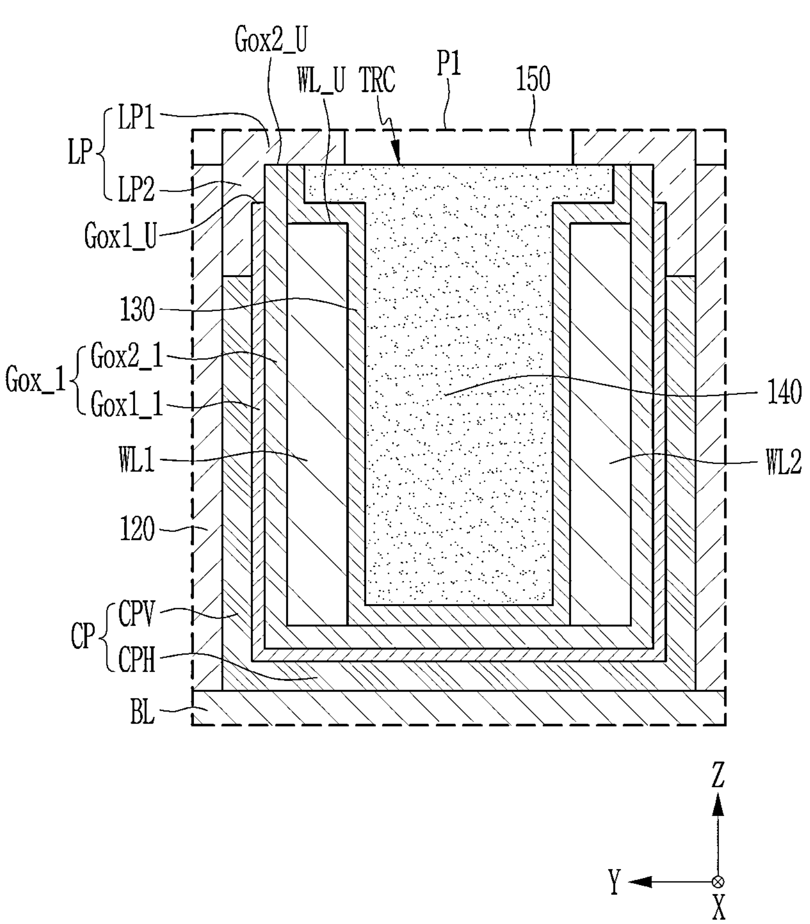
FIG. 4 to FIG. 6 are enlarged views of part P1 of FIG. 2 according to several embodiments.
Figure 5:
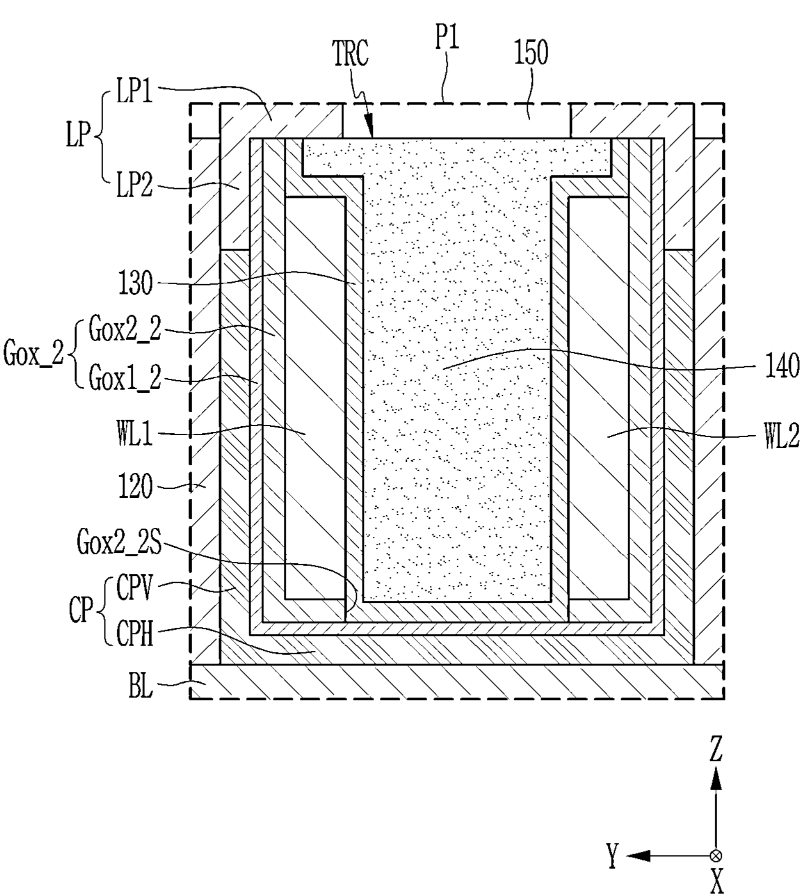
Figure 6:
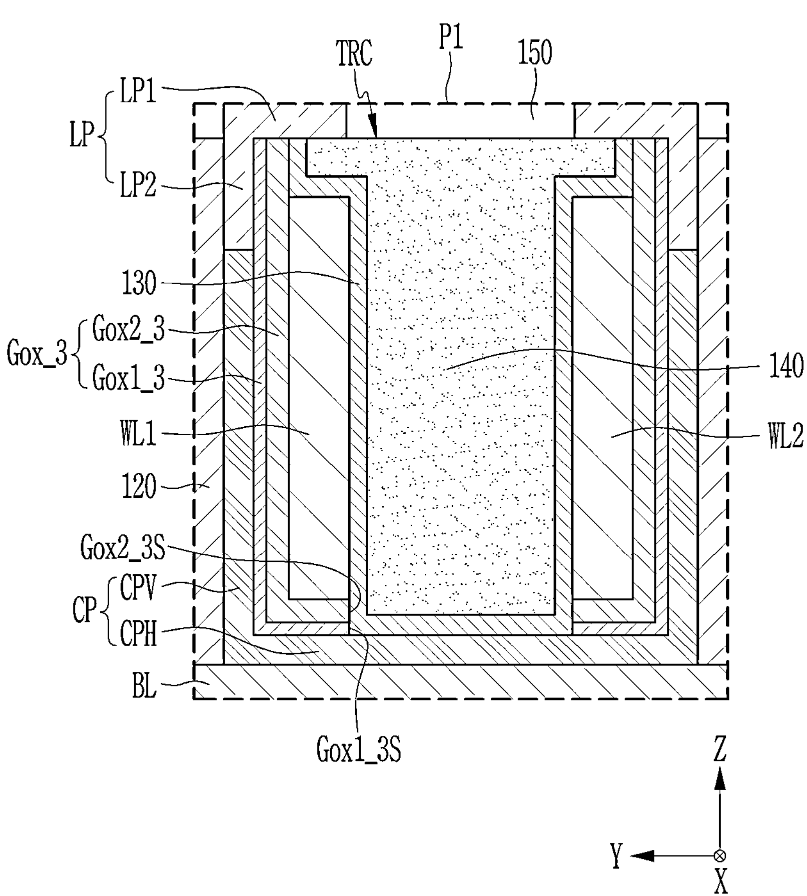

FIG. 4 to FIG. 6 are enlarged views of part P1 of FIG. 2 according to several embodiments.

According to the embodiment shown in FIG. 4, unlike in the embodiment shown in FIG. 3, the upper surfaces Gox1_U of the first gate insulating patterns Gox1_1, the upper surfaces Gox2_U of the second gate insulating patterns Gox2_1, and the upper surfaces WL_U of the word lines WL1 and WL2 may be located at different levels.

The upper surfaces Gox1_U of the first gate insulating patterns Gox1_1 may be located at a level lower than the level of the upper surfaces Gox2_U of the second gate insulating patterns Gox2_1, and be located at a level higher than the level of the upper surfaces WL_U of the word lines WL1 and WL2.

The upper surfaces Gox1_U of the first gate insulating patterns Gox1_1, the upper surfaces Gox2_U of the second gate insulating patterns Gox2_1, and the upper surfaces WL_U of the word lines WL1 and WL2 may be located at different levels as described above due to differences in the etching selectivity among the first gate insulating patterns Gox1_1, the second gate insulating patterns Gox2_1, and the word lines WL1 and WL2.

When the first gate insulating patterns Gox1_1, the second gate insulating patterns Gox2_1, and the word lines WL1 and WL2 contain different materials, they may be different in the etching selectivity during the etching process for forming the first gate insulating patterns Gox1_1, the second gate insulating patterns Gox2_1, and the word lines WL1 and WL2

In this case, in the etching process, the thicknesses by which the first gate insulating patterns Gox1_1, the second gate insulating patterns Gox2_1, and the word lines WL1 and WL2 are etched may be different from one another, and the upper surfaces Gox1_U of the first gate insulating patterns Gox1_1, the upper surfaces Gox2_U of the second gate insulating patterns Gox2_1, and the upper surfaces WL_U of the word lines WL1 and WL2 may be located at different levels. However, the locations of the upper surfaces Gox1_U of the first gate insulating patterns Gox1_1, the upper surfaces Gox2_U of the second gate insulating patterns Gox2_1, and the upper surfaces WL_U of the word lines WL1 and WL2 may be variously changed according to the order of the processes of forming the gate insulating patterns Gox and the word lines WL1 and WL2, the conditions for those processes, etc.

For example, the upper surfaces Gox1_U of the first gate insulating patterns Gox1_1 may be located at a level lower than the level of the upper surfaces Gox2_U of the second gate insulating patterns Gox2_1, and be located substantially on the same level with the upper surfaces WL_U of the word lines WL1 and WL2.

Also, when the upper surfaces Gox1_U of the first gate insulating patterns Gox1_1 are located at a level lower than the level of the upper surfaces Gox2_U of the second gate insulating patterns Gox2_1, the upper surfaces Gox1_U of the first gate insulating patterns Gox1_1 and the upper surfaces Gox2_U of the second gate insulating patterns Gox2_1 may be in contact with the second parts LP2 of the landing pads LP at different levels, respectively.

According to the embodiment shown in FIG. 5, unlike in the embodiment shown in FIG. 3, portions of the second gate insulating patterns Gox2_2 may be disposed so as to be spaced apart in the second direction (Y direction) with a second insulating pattern 130 and a third insulating pattern 140 interposed therebetween.

The second gate insulating patterns Gox2_2 include horizontal parts that are located on the lower surfaces of the word lines WL1 and WL2, and vertical parts that extend in the third direction (Z direction) from end parts of the horizontal parts and are located on side surfaces of the word lines WL1 and WL2.

The horizontal parts of the second gate insulating patterns Gox2_2 may not be disposed on the parts of first gate insulating patterns Gox1_2 which do not overlap the word lines WL1 and WL2 in the third direction (Z direction). In other words, in a cross-sectional view, the horizontal parts of the second gate insulating patterns Gox2_2 located between the first word lines WL1 and the first gate insulating patterns Gox1_2 adjacent to the first word lines WL1 may be disposed to be apart in the second direction (Y direction) from the horizontal parts of the second gate insulating patterns Gox2_2 located between the second word lines WL2 and the first gate insulating patterns Gox1_2 adjacent to the second word lines WL2, with a second insulating pattern 130, and a third insulating pattern 140 interposed between each pair of horizontal parts. In this case, end parts Gox2_2S of the second gate insulating patterns Gox2_2 may be located on the upper surfaces of the first gate insulating patterns Gox1_2.

Therefore, the horizontal parts of the second gate insulating patterns Gox2_2 may extend along the lower surfaces of the word lines WL1 and WL2, and the vertical parts of the second gate insulating patterns Gox2_2 may extend along the side surfaces of the word lines WL1 and WL2 close to the first gate insulating patterns Gox1.

Referring to FIG. 5, the second insulating patterns 130 and the third insulating patterns 140 may further extend in the third direction (Z direction) toward the bit lines BL as compared to the embodiment shown in FIG. 3. In this case, the second insulating patterns 130 may be in contact with the upper surfaces of the first gate insulating patterns Gox1_2 and the end parts Gox2_2S of the second gate insulating patterns Gox2_2 close to the third insulating patterns 140.

Further, the end parts Gox2_2S of the second gate insulating patterns Gox2_2 close to the third insulating patterns 140 may be aligned on substantially the same boundary with the side surfaces of the word lines WL1 and WL2 close to the third insulating patterns 140.

In some embodiments, the end parts Gox2_2S of the second gate insulating patterns Gox2_2 close to the third insulating patterns 140 may not be disposed in lines with the side surfaces of the word lines WL1 and WL2. For example, the end parts Gox2_2S of the second gate insulating patterns Gox2_2 close to the third insulating patterns 140 may be disposed so as to further protrude in the second direction (Y direction) from the side surfaces of the word lines WL1 and WL2.

According to the embodiment shown in FIG. 6, unlike in the embodiment shown in FIG. 5, portions of the first gate insulating patterns Gox1_3 may be disposed to be apart with a second insulating pattern 130 and a third insulating pattern 140 interposed between each pair of first gate insulating patterns.

The first gate insulating patterns Gox1_3 may include horizontal parts which are located on the lower surfaces of the word lines WL1 and WL2 and vertical parts which extend in the third direction (Z direction) from end parts of the horizontal parts and are located on side surfaces of the word lines WL1 and WL2.

The horizontal parts of the first gate insulating patterns Gox1_3 may not be disposed on parts of the horizontal parts of the channel patterns CP which do not overlap second gate insulating patterns Gox2_3 in the third direction (Z direction).

In other words, in a cross-sectional view, the horizontal parts of the first gate insulating patterns Gox1_3 located between the second gate insulating patterns Gox2_3 and the horizontal parts CPH of the channel patterns CP which are adjacent to the first word lines WL1 may be disposed to be apart in the second direction (Y direction) with the horizontal parts of the first gate insulating patterns Gox1_3 located between the second gate insulating patterns Gox2_3 and the horizontal parts CPH of the channel patterns CP which are adjacent to the second word lines WL2 with a second insulating pattern 130, and a third insulating pattern 140 between each pair of horizontal parts. In this case, end parts Gox1_3S of the horizontal parts of the first gate insulating patterns Gox1_3 may be located on the horizontal parts CPH of the channel patterns CP.

Therefore, the horizontal parts of the first gate insulating patterns Gox1_3 may extend along the horizontal parts of the second gate insulating patterns Gox2_3, and the vertical parts of the first gate insulating patterns Gox1_3 may extend along the vertical parts of the second gate insulating patterns Gox2_3.

According to the embodiment shown in FIG. 6, the second insulating patterns 130 and the third insulating patterns 140 may further extend in the third direction (Z direction) toward the bit lines BL as compared to the embodiment shown in FIG. 5.

In this case, the second insulating patterns 130 may be in contact with the upper surfaces of the channel patterns CP, the end parts Gox1_3S of the first gate insulating patterns Gox1_3 close to the third insulating patterns 140, and the end parts Gox2_3S of the second gate insulating patterns Gox2_3 close to the third insulating patterns 140.

Further, the end parts Gox1_3S of the first gate insulating patterns Gox1_3 close to the third insulating patterns 140 may be aligned on substantially the same boundary with the end parts Gox2_3S of the second gate insulating patterns Gox2_3 close to the third insulating patterns 140. However, the locations of them are not limited thereto.

In some embodiments, the end parts Gox1_3S of the first gate insulating patterns Gox1_3 close to the third insulating patterns 140 and the end parts Gox2_3S of the second gate insulating patterns Gox2_3 close to the third insulating patterns 140 may not be disposed in lines with each other. For example, the end parts Gox2_3S of the second gate insulating patterns Gox2_3 close to the third insulating patterns 140 may be disposed so as to further protrude in the second direction (Y direction) from the end parts Gox1_3S of the first gate insulating patterns Gox1_3 close to the third insulating patterns 140.

As described above, the shapes and arrangements of the gate insulating patterns Gox_1, Gox_2, and Gox_3 according to the embodiments shown in FIG. 4 to FIG. 6 may be due to differences in the process of forming the gate insulating patterns Gox_1, Gox_2, and Gox_3. Therefore, the shapes and arrangements of the gate insulating patterns Gox_1, Gox_2, and Gox_3 are not limited to the embodiments shown in FIG. 4 to FIG. 6, and may be variously changed.

In semiconductor devices according to the embodiments shown in FIG. 4 to FIG. 6, the gate insulating patterns Gox_1, Gox_2, and Gox_3 may be formed of multiple layers, which include first gate insulating patterns Gox1_1, Gox1_2, and Gox1_3 containing aluminum oxide ($Al_2O_3$), silicon oxide ($SiO_2$), or a low dielectric (low-k) material having a dielectric constant relatively smaller than that of silicon oxide, and second gate insulating patterns Gox2_1, Gox2_2, and Gox2_3 containing a high dielectric (high-k) material having a dielectric constant relatively larger than that of silicon oxide. Therefore, semiconductor devices with improved reliability can be provided.

Hereinafter, a method for fabricating a semiconductor device will be described with reference to FIG. 7 to FIG. 17. Hereinafter, components identical to components described above will be denoted by the same reference symbols, and a redundant description thereof will not be made or will be made in brief, and the differences in them from the above-described components will be mainly described.

FIG. 7 to FIG. 17 are cross-sectional views for explaining methods for fabricating semiconductor devices according to some embodiments.

Figure 7:
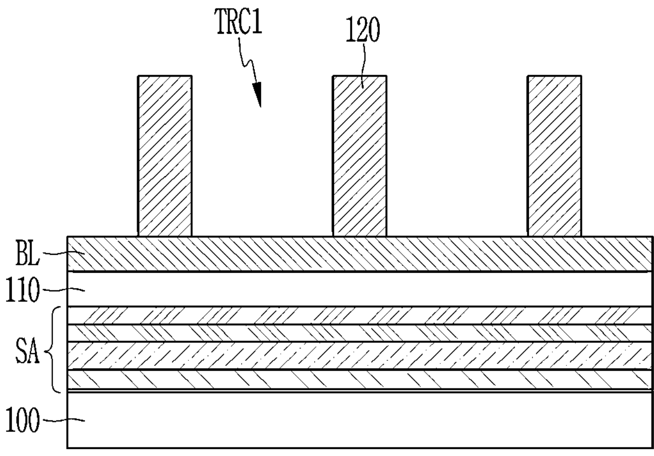
FIG. 7 to FIG. 17 are cross-sectional views for explaining a method for fabricating a semiconductor device according to some embodiments.
Figure 7:
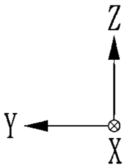

First, referring to FIG. 7, on a substrate 100, NMOS and PMOS transistors may be formed as core and peripheral circuits SA. Further, peripheral circuit wiring lines and peripheral circuit contact plugs may be formed so as to be electrically coupled to the core and peripheral circuits SA.

Subsequently, a lower insulating layer 110 may be formed on the substrate 100 so as to cover the core and peripheral circuits SA, the peripheral circuit wiring lines, and the peripheral circuit contact plugs. The lower insulating layer 110 may include multiple insulating films stacked. For example, the lower insulating layer 110 may include a silicon oxide film, a silicon nitride film, a silicon oxynitride film, and/or a low dielectric film.

Next, on the lower insulating layer 110, bit lines BL may be formed so as to extend in the second direction (Y direction) and be spaced apart in the first direction (X direction), and an insulating material may be filled between the bit lines BL. The bit lines BL may be formed by depositing a conductive layer on the lower insulating layer 110 and patterning the conductive layer.

Subsequently, on the bit lines BL, first insulating patterns 120, which define first trenches TRC1, may be formed so as to extend in the first direction (X direction) and be spaced apart in the second direction (Y direction).

The first trenches TRC1 may be formed so as to cross the bit lines BL. The first insulating patterns 120 may be formed of, for example, a silicon oxide film, a silicon nitride film, a silicon oxynitride film, and/or a low dielectric film.

Figure 8:
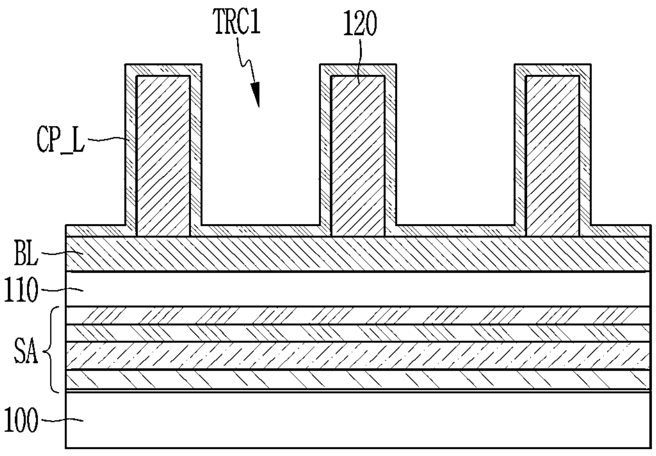
Figure 8:
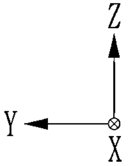
Figure 9:
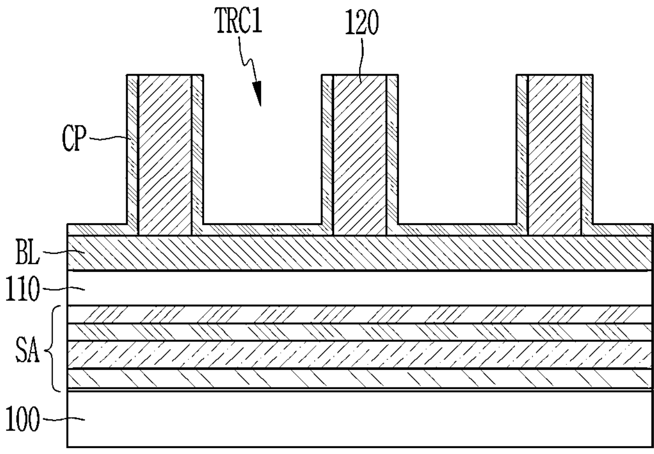
Figure 9:
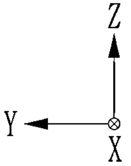

Subsequently, referring to FIG. 8 and FIG. 9, a channel pattern material layer CP_L may be deposited on the upper surfaces and side surfaces of the first insulating patterns 120 and the upper surfaces of the bit lines BL so as to conform to those surfaces.

The channel pattern material layer CP_L may be formed using at least one of physical vapor deposition (PVD), thermal chemical vapor deposition (thermal CVD), low pressure chemical vapor deposition (LP-CVD), plasma enhanced chemical vapor deposition (PE-CVD), or atomic layer deposition (ALD) technologies. However, the method of deposing the channel pattern material layer CP_L is not limited thereto, and may be variously changed.

The channel pattern material layer CP_L may contain a semiconductor material, an oxide semiconductor material, or a two-dimensional semiconductor material. The channel pattern material layer CP_L may contain, for example, silicon, germanium, silicon-germanium, or indium gallium zinc oxide (IGZO).

Next, the channel pattern material layer CP_L may be patterned such that channel patterns CP are formed inside the first trenches TRC1.

Sacrificial patterns may be formed in the first trenches TRC1 so as to fill the first trenches TRC1, and parts of the channel pattern material layer CP_L located on the upper surfaces of the first insulating patterns 120 may be patterned such that the upper surfaces of the first insulating patterns 120 are exposed.

In this case, the channel patterns CP may be formed along the profiles of the first trenches TRC1, and the upper surfaces of the channel patterns CP may be located substantially on the same level with the upper surfaces of the first insulating patterns 120.

The channel patterns CP may be parts of the channel pattern material layer CP_L remaining inside the first trenches TRC1 while patterning the channel pattern material layer CP_L. However, the process of forming the channel patterns CP is not limited thereto. For example, the channel patterns CP may be formed by forming sacrificial patterns to fill the first trenches TRC1 and performing a planarizing process to expose the upper surfaces of the first insulating patterns 120.

Figure 10:
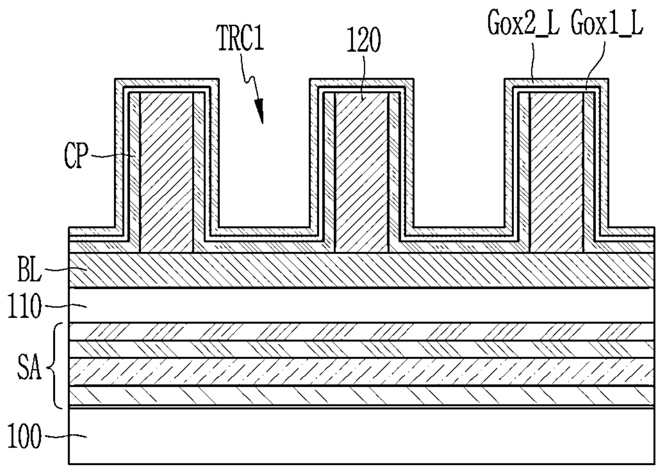
Figure 10:
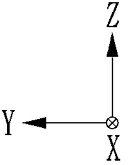
Figure 11:
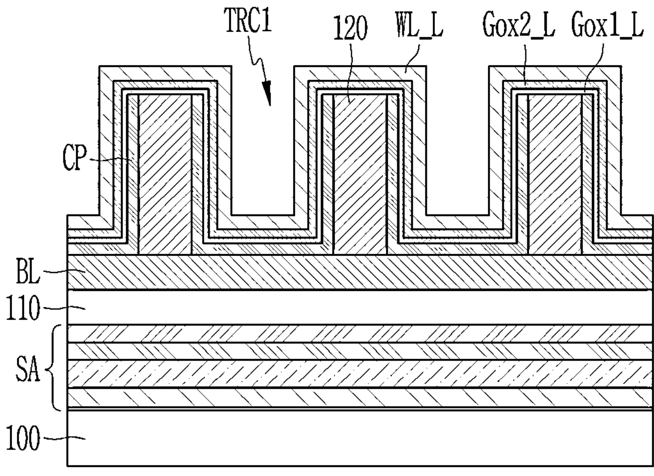
Figure 11:
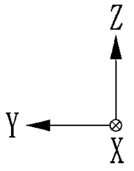

Next, referring to FIG. 10 and FIG. 11, a first gate insulating pattern material layer Gox1_L, a second gate insulating pattern material layer Gox2_L, and a word line material layer WL_L may be sequentially deposited so as to cover the first insulating patterns 120 and the channel patterns CP while conforming to them.

The first gate insulating pattern material layer Gox1_L, the second gate insulating pattern material layer Gox2_L, and the word line material layer WL_L may be formed using at least one of physical vapor deposition (PVD), thermal chemical vapor deposition (thermal CVD), low pressure chemical vapor deposition (LP-CVD), plasma enhanced chemical vapor deposition (PE-CVD), or atomic layer deposition (ALD) technologies. However, the methods of depositing the first gate insulating pattern material layer Gox1_L, the second gate insulating pattern material layer Gox2_L, and the word line material layer WL_L are not limited thereto, and may be variously changed.

The first gate insulating pattern material layer Gox1_L may contain aluminum oxide ($Al_2O_3$), silicon oxide ($SiO_2$), or a combination thereof. Also, the first gate insulating pattern material layer Gox1_L may contain a low dielectric (low-k) material having a dielectric constant relatively smaller than that of silicon oxide ($SiO_2$). For example, the first gate insulating pattern material layer Gox1_L may contain silicon oxynitride (SiON), silicon oxycarbonitride (SiCON) or a combination thereof.

The second gate insulating pattern material layer Gox2_L may contain a high dielectric (high-k) material having a dielectric constant relatively larger than that of silicon oxide ($SiO_2$). The high dielectric (high-k) material may contain, for example, an oxide containing one or more of Ti, Ta, Nb, La, Ba, Sr, Y, and Lu. However, the high dielectric (high-k) material is not limited thereto, and may contain an oxide containing one or more of Li, Be, Mg, Ca, Sc, Al, Ce, Pr, Sm, Eu, Gd, Tb, Dy, Ho, Er, Tm, Yb, and the like other than the above-mentioned materials.

The word line material layer WL_L may contain, for example, doped polysilicon, a metal, conductive metal nitride, conductive metal silicide, conductive metal oxide, or a combination thereof.

Figure 12A:
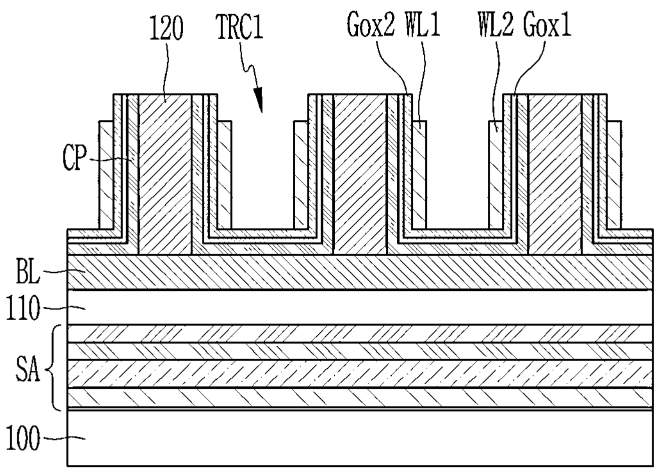
Figure 12A:
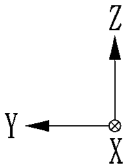

Next, referring to FIG. 12A additionally, the process of etching the first gate insulating pattern material layer Gox1_L, the second gate insulating pattern material layer Gox2_L, and the word line material layer WL_L may be performed such that the first gate insulating patterns Gox1, the second gate insulating patterns Gox2, and the word lines WL1 and WL2 are formed inside the first trenches TRC1.

In other words, an etching process may be performed on the word line material layer WL_L such that inside each first trench TRC1, a pair of word lines WL1 and WL2 are formed to be apart from each other in the second direction (Y direction).

Further, the first gate insulating patterns Gox1 and the second gate insulating patterns Gox2 may be sequentially stacked inside the first trenches TRC1 so as to cover the first trenches TRC1 while conforming to them.

In other words, the first gate insulating patterns Gox1, the second gate insulating patterns Gox2, and the word lines WL1 and WL2 may be parts of the first gate insulating pattern material layer Gox1_L, the second gate insulating pattern material layer Gox2_L, and the word line material layer WL_L remaining in the first trenches TRC1 while etching the first gate insulating pattern material layer Gox1_L, the second gate insulating pattern material layer Gox2_L, and the word line material layer WL_L.

While the processes of etching the first gate insulating pattern material layer Gox1_L, the second gate insulating pattern material layer Gox2_L, and the word line material layer WL_L are performed, the upper surfaces of the word lines WL1 and WL2 may be lowered down below the upper surfaces of the first gate insulating patterns Gox1 and the upper surfaces of the second gate insulating patterns Gox2.

While the word line material layer WL_L, the first gate insulating pattern material layer Gox1_L, and the second gate insulating pattern material layer Gox2_L are sequentially etched such that the upper surfaces of the first insulating patterns 120 are exposed, the word line material layer WL_L may be etched together with the first gate insulating pattern material layer Gox1_L and the second gate insulating pattern material layer Gox2_L. In this case, the thickness of the word line material layer may decrease, whereby the upper surfaces of the word lines WL1 and WL2 may be lowered down below the upper surfaces of the first gate insulating patterns Gox1 and the upper surfaces of the second gate insulating patterns Gox2. In this case, the upper surfaces of the first gate insulating patterns Gox1 and the upper surfaces of the second gate insulating patterns Gox2 may be located substantially on the same level with each other.

In some embodiments, the process of etching the first gate insulating pattern material layer Gox1_L and the second gate insulating pattern material layer Gox2_L may be performed simultaneously with the process of etching the word line material layer WL_L. Also, in some embodiments, during the process of etching the word line material layer WL_L, an etching process of making the upper surfaces of the word lines WL1 and WL2 recessed may be additionally performed.

The processes of etching the first gate insulating pattern material layer Gox1_L, the second gate insulating pattern material layer Gox2_L, and the word line material layer WL_L are not limited to the embodiment shown in FIG. 12A.

Figure 12B:
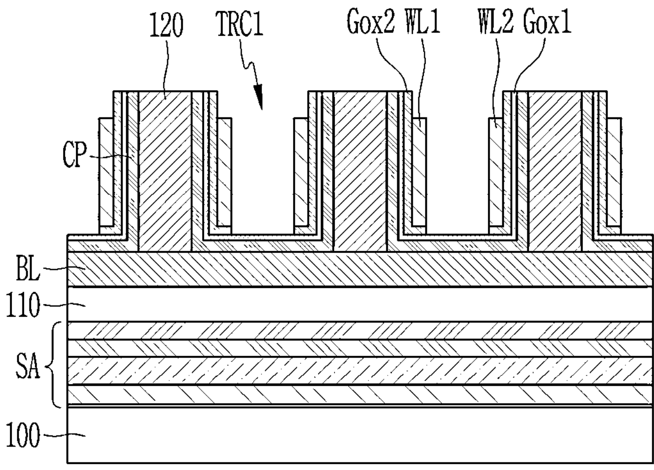
Figure 12B:
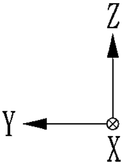

For example, like in the embodiment shown in FIG. 12B, the processes of etching the first gate insulating pattern material layer Gox1_L, the second gate insulating pattern material layer Gox2_L, and the word line material layer WL_L may be performed to form the second gate insulating patterns Gox2 in the first trenches TRC1 such that the second gate insulating patterns extend along the lower surfaces and side surfaces of the word lines WL1 and WL2 and expose the upper surfaces of the first gate insulating patterns Gox1 located between the word lines WL1 and WL2.

In other words, in the case of performing the processes of etching the first gate insulating pattern material layer Gox1_L, the second gate insulating pattern material layer Gox2_L, and the word line material layer WL_L like in the embodiment shown in FIG. 12B, the gate insulating patterns Gox_2 according to the embodiment shown in FIG. 5 may be formed.

Figure 12C:
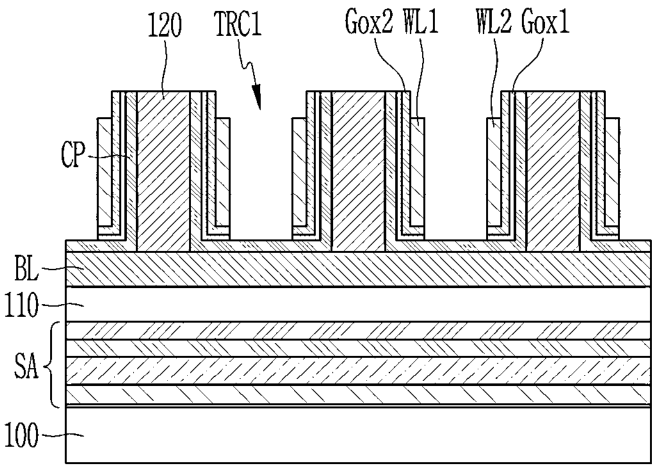
Figure 12C:
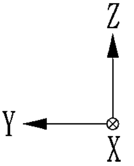

As another example, like in the embodiment shown in FIG. 12C, the process of etching the first gate insulating pattern material layer Gox1_L, the second gate insulating pattern material layer Gox2_L, and the word line material layer WL_L may be performed to form the first gate insulating patterns Gox1 and the second gate insulating patterns Gox2 such that the first gate insulating patterns and the second gate insulating patterns sequentially stacked in the first trenches TRC1 and extend along the lower surfaces and side surfaces of the word lines WL1 and WL2 and expose the upper surfaces of the channel patterns CP located between the word lines WL1 and WL2.

In other words, in the case of performing the processes of etching the first gate insulating pattern material layer Gox1_L, the second gate insulating pattern material layer Gox2_L, and the word line material layer WL_L like in the embodiment shown in FIG. 12C, the gate insulating patterns Gox_3 according to the embodiment shown in FIG. 6 may be formed.

Figure 12D:
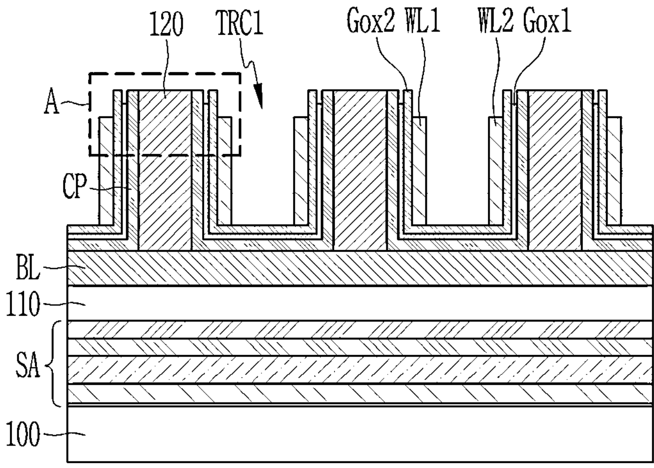
Figure 12D:
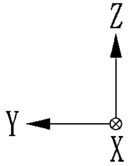

As another example, like in the embodiment shown in FIG. 12D, during the process of etching the first gate insulating pattern material layer Gox1_L, the second gate insulating pattern material layer Gox2_L, and the word line material layer WL_L, the upper surfaces Gox1_U of the first gate insulating patterns Gox1 may be located at a level different from the level of the upper surfaces Gox2_U of the second gate insulating patterns Gox2.

Figure 13:
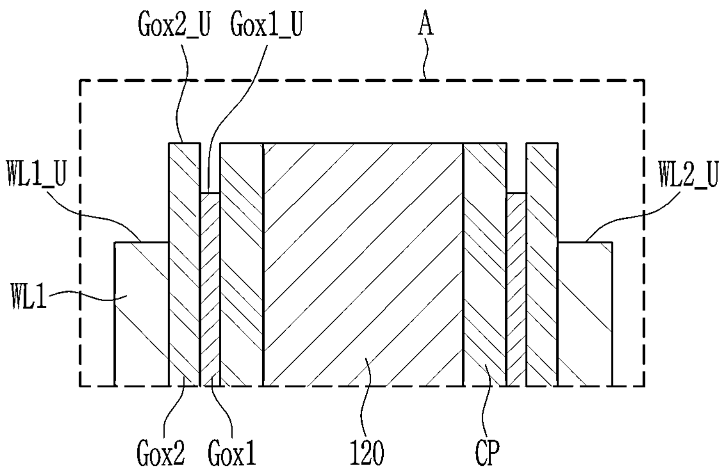

Referring to FIG. 13 which is an enlarged view of part A of FIG. 12D in addition to FIG. 12D, unlike in the embodiment shown in FIG. 12A, the upper surfaces Gox1_U of the first gate insulating patterns Gox1 may be located at a level lower than the level of the upper surface Gox2_U of the second gate insulating patterns Gox2.

The first gate insulating pattern material layer Gox1_L may be made of a material having etching selectivity higher than that of the second gate insulating pattern material layer Gox2_L. In this case, in the process of etching the first gate insulating pattern material layer Gox1_L such that the upper surfaces of the first insulating patterns 120 are exposed, the first gate insulating pattern material layer Gox1_L may be etched at a rate relatively higher than that of the second gate insulating pattern material layer Gox2_L. Therefore, the upper surfaces Gox1_U of the first gate insulating patterns Gox1 which are formed inside the first trenches TRC1 may be located at a level lower than the level of the upper surfaces Gox2_U of the second gate insulating patterns Gox2.

In addition, in the embodiments shown in FIG. 12B and FIG. 12C, it is shown that the upper surfaces Gox1_U of the first gate insulating patterns Gox1 are located substantially on the same level with the upper surfaces Gox2_U of the second gate insulating patterns Gox2; however, the level of the upper surfaces of the first gate insulating patterns is not limited thereto.

For example, in some embodiments shown in FIG. 12B and FIG. 12C, in the process of etching the first gate insulating pattern material layer Gox1_L, the second gate insulating pattern material layer Gox2_L, and the word line material layer WL_L, the upper surfaces Gox1_U of the first gate insulating patterns Gox1 may be located at a level lower than the level of the upper surfaces Gox2_U of the second gate insulating patterns Gox2.

Figure 14:
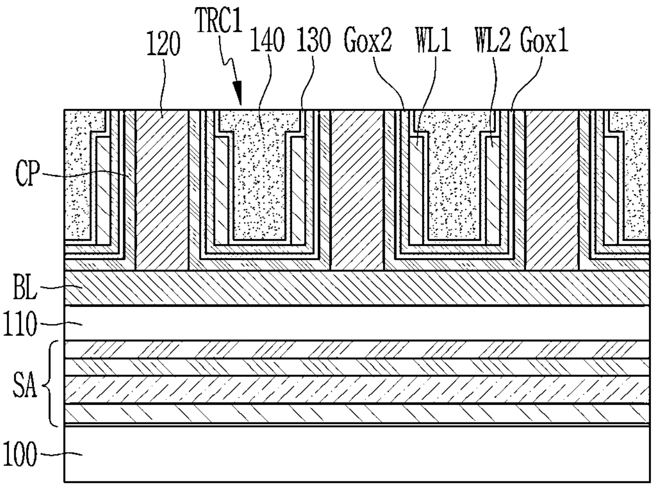
Figure 14:
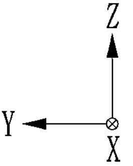

Subsequently, referring to FIG. 14, on the second gate insulating patterns Gox2 and the word lines WL1 and WL2, the second insulating patterns 130 may be formed and the third insulating patterns 140 may be formed so as to fill the first trenches TRC1.

The second insulating patterns 130 may be formed so as to conform to the profiles of the second gate insulating patterns Gox2 and the word lines WL1 and WL2 in the first trenches TRC1.

The second insulating patterns 130 may be deposited using at least one of physical vapor deposition (PVD), thermal chemical vapor deposition (thermal CVD), low pressure chemical vapor deposition (LP-CVD), plasma enhanced chemical vapor deposition (PE-CVD), or atomic layer deposition (ALD) technologies. However, the method of deposing the second insulating patterns 130 is not limited thereto, and may be variously changed.

Subsequently, the third insulating patterns 140 may be formed so as to fill the spaces in the first trenches TRC1 remaining after the second insulating patterns 130 were formed.

The process of forming the second insulating patterns 130 and the third insulating patterns 140 may include a planarizing process for exposing the upper surfaces of the first insulating patterns 120, the upper surfaces of the channel patterns CP, the upper surfaces of the first gate insulating patterns Gox1, and the second gate insulating patterns Gox2. In other words, the second insulating patterns 130 and the third insulating patterns 140 may be parts of the second insulating patterns 130 and the third insulating patterns 140 remaining in the first trenches TRC1 during the planarizing process.

Figure 15:
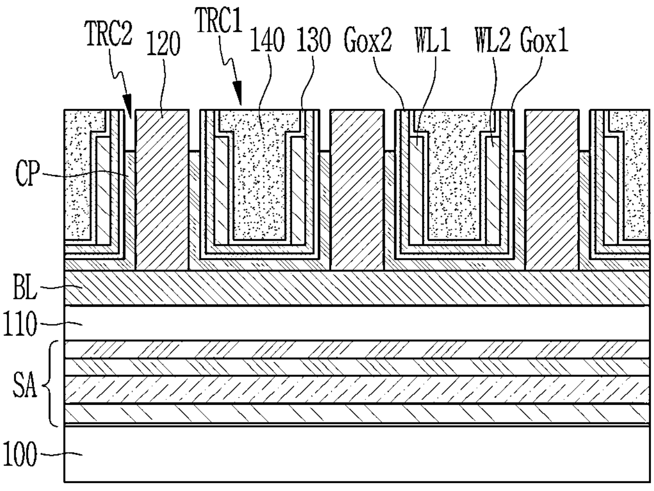
Figure 15:
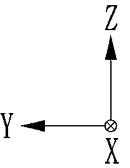

Subsequently, referring to FIG. 15, second trenches TRC2 may be formed through an etching process of making parts of the channel patterns CP recessed.

The second trenches TRC2 may be formed by performing wet etching on parts of the channel patterns CP from the upper surfaces toward the lower surfaces, so as to extend in the third direction (Z direction). In this case, the upper surfaces of the channel patterns CP may be located at a level lower than the level of the upper surfaces of the word lines WL1 and WL2.

In an embodiment, parts of the channel patterns CP may be etched by wet etching using an etchant for selectively etching the channel patterns CP. However, the etching process of making the channel patterns CP recessed is not limited thereto, and may be variously changed.

Figure 16:
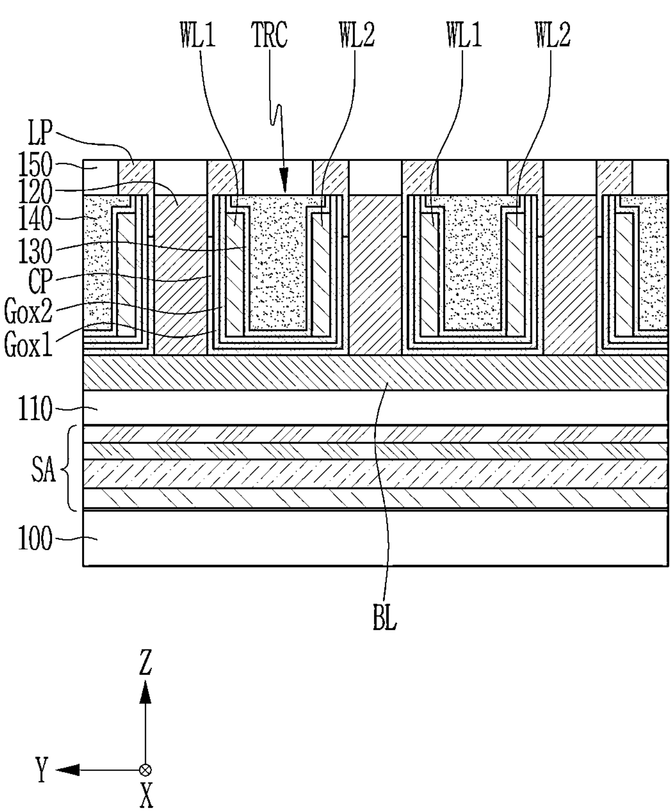
Figure 17:
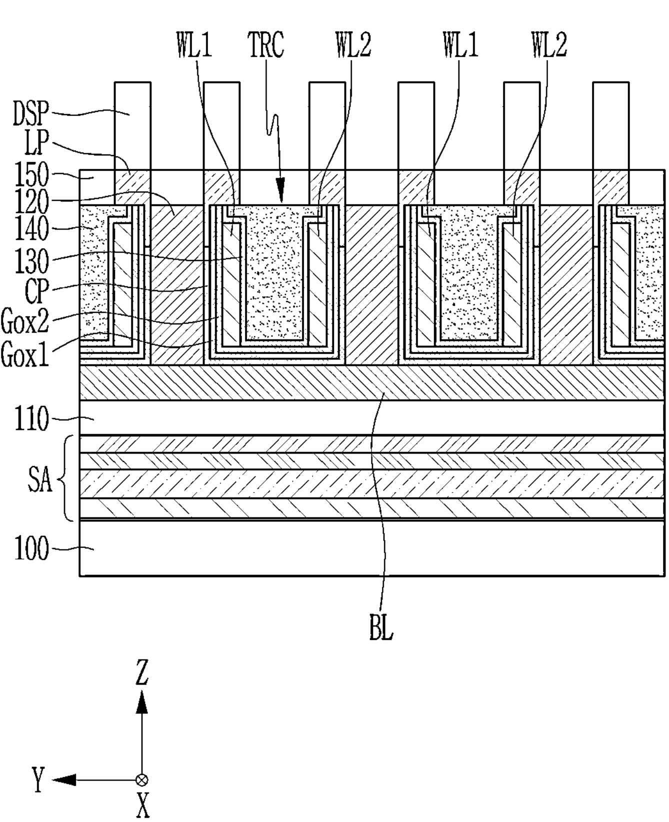

Subsequently, referring to FIG. 16 and FIG. 17 in addition to FIG. 15, the landing pads LP may be formed so as to fill the second trenches TRC2 and be connected to the channel patterns CP.

The landing pads LP may be patterned, and holes may be formed to expose the upper surfaces of the first insulating patterns 120 and the third insulating patterns 140, and the interlayer insulating layer 150 may be formed to fill the holes, and a planarizing process may be formed. However, the order in which the landing pads LP and the interlayer insulating layer 150 are formed is not limited thereto, and in some embodiments, after the interlayer insulating layer 150 is formed and patterned, the landing pads LP may be formed so as to pass through the interlayer insulating layer 150.

Subsequently, the data storage patterns DSP may be formed on the landing pads LP, respectively. In an embodiment, when the data storage patterns DSP include capacitors, lower electrodes, capacitor dielectric films, and upper electrodes may be sequentially formed.

While this disclosure has been described in connection with what is presently considered to be practical example embodiments, it is to be understood that inventive concepts not limited to the disclosed embodiments, but, on the contrary, are intended to cover various modifications and equivalent arrangements included within the spirit and scope of the appended claims.

What is claimed is:

1. A semiconductor device comprising:
- a substrate;
- a bit line on the substrate;
- a channel pattern on the bit line, the channel pattern extending in a vertical direction perpendicular to an upper surface of the bit line;
- a word line intersecting the bit line and being spaced apart from the channel pattern;
- a gate insulating pattern between the channel pattern and the word line in a horizontal direction parallel to the upper surface of the bit line;
- an insulating pattern on the word line; and
- a landing pad connected to the channel pattern, wherein
- the gate insulating pattern includes a first gate insulating pattern and a second gate insulating pattern,
- the first gate insulating pattern is on the channel pattern and has a first dielectric constant,
- the second gate insulating pattern is between the first gate insulating pattern and the word line,
- the second gate insulating pattern has a second dielectric constant,
- the second dielectric constant is different from the first dielectric constant,
- the first gate insulating pattern has a first width,
- the second gate insulating pattern has a second width, and
- the second width is different from the first width.

2. The semiconductor device of claim 1, wherein
- the first gate insulating pattern is in contact with the channel pattern, and
- the second gate insulating pattern is in contact with the word line.

3. The semiconductor device of claim 2, wherein
- the first gate insulating pattern is in contact with the second gate insulating pattern.

4. The semiconductor device of claim 1, wherein
- the first gate insulating pattern contains a first material,
- the second gate insulating pattern contains a second material,
- the second material is different from the first material, and
- a dielectric constant of the second material is larger than a dielectric constant of the first material.

5. The semiconductor device of claim 4, wherein
- the first material contains one or more of aluminum oxide, silicon oxide, and silicon oxynitride, and
- the second material contains an oxide containing one or more of Ti, Ta, Nb, La, Ba, Sr, Y, and Lu.

6. The semiconductor device of claim 1, wherein
- a level of an upper surface of the first gate insulating pattern and a level of an upper surface of the second gate insulating pattern are higher than a level of an upper surface of the word line.

7. The semiconductor device of claim 6, wherein
- the level of the upper surface of the first gate insulating pattern is lower than the level of the upper surface of the second gate insulating pattern.

8. The semiconductor device of claim 1, wherein
- the second dielectric constant is larger than the first dielectric constant.

9. The semiconductor device of claim 8, wherein
- the second dielectric constant is 5 to 60.

10. The semiconductor device of claim 1, wherein
- the channel pattern includes a horizontal part, a first vertical part extending from a first end of the horizontal part, and a second vertical part extending in the vertical direction from a second end part of the horizontal part,
- the word line includes a first word line and a second word line spaced apart from each other between the first vertical part and the second vertical part,
- the insulating pattern is between the first word line and the second word line, and one of
- portions of the second gate insulating pattern are apart from each other with the insulating pattern therebetween, or
- the portions of the second gate insulating pattern are apart from each other with the insulating pattern therebetween and portions of the first gate insulating pattern are apart from each other with the insulating pattern therebetween.

11. A semiconductor device comprising:
- a substrate;
- a bit line on the substrate;
- a channel pattern on the bit line, the channel pattern including a horizontal part, a first vertical part, and a second vertical part, the first vertical part extending in a vertical direction from a first end part of the horizontal part and the second vertical part extending in the vertical direction from a second end part of the horizontal part;
- a word line intersecting the bit line, the word line including a first word line and a second word line spaced apart from each other between the first vertical part and the second vertical part;

a gate insulating pattern between the channel pattern and the word line;

an insulating pattern on the word line; and a landing pad connected to the channel pattern, wherein the gate insulating pattern includes a first gate insulating pattern and a second gate insulating pattern, the first gate insulating pattern is on the channel pattern and has a first dielectric constant, the second gate insulating pattern is between the first gate insulating pattern and the word line, the second gate insulating pattern has a second dielectric constant, the second dielectric constant is larger than the first dielectric constant, a width of the first gate insulating pattern is smaller than a width of the second gate insulating pattern, and portions of the second gate insulating pattern are spaced apart from each other with the insulating pattern therebetween.

12. The semiconductor device of claim 11, wherein the insulating pattern is in contact with an upper surface of the first gate insulating pattern and an end part of the second gate insulating pattern on the upper surface of the first gate insulating pattern.

13. The semiconductor device of claim 11, wherein a vertical part of the first gate insulating pattern is apart from the insulating pattern, and the insulating pattern is in contact with an upper surface of the channel pattern and an end part of the first gate insulating pattern on the upper surface of the channel pattern.

14. The semiconductor device of claim 13, wherein the end part of the first gate insulating pattern and an end part of the second gate insulating pattern are aligned on a same boundary.

15. The semiconductor device of claim 11, wherein the first gate insulating pattern contains one or more of aluminum oxide, silicon oxide, and silicon oxynitride, and the second gate insulating pattern contains an oxide containing one or more of Ti, Ta, Nb, La, Ba, Sr, Y, and Lu.

16. The semiconductor device of claim 11, wherein the second dielectric constant is 5 to 60.

17. The semiconductor device of claim 11, wherein the first gate insulating pattern is in contact with the channel pattern and the second gate insulating pattern, and the second gate insulating pattern is in contact with the word line.

18. A method for fabricating a semiconductor device, comprising:

forming a bit line on a substrate;

forming a channel pattern on the bit line;

forming a gate insulating pattern on the channel pattern, the gate insulating pattern including a first gate insulating pattern having a first dielectric constant and a second gate insulating pattern on the first gate insulating pattern, the second gate insulating pattern having a second dielectric constant, the second dielectric constant being larger than the first dielectric constant;

forming a word line on the second gate insulating pattern, the word line intersecting the channel pattern and being spaced apart from the channel pattern;

forming an insulating pattern on the word line; and forming a landing pad connected to the channel pattern, wherein a width of the first gate insulating pattern is smaller than a width of the second gate insulating pattern.

19. The method for fabricating the semiconductor device of claim 18, wherein the first gate insulating pattern contains one or more of aluminum oxide, silicon oxide, and silicon oxynitride, and the second gate insulating pattern contains an oxide containing one or more of Ti, Ta, Nb, La, Ba, Sr, Y, and Lu.

20. The method for fabricating the semiconductor device of claim 18, wherein a level of an upper surface of the first gate insulating pattern is lower than a level of an upper surface of the second gate insulating pattern.

* * * * *